(12) United States Patent
Hirai et al.

(10) Patent No.: US 9,190,499 B2
(45) Date of Patent: Nov. 17, 2015

(54) NONVOLATILE SEMICONDUCTOR MEMORY DEVICE, CAPACITANCE ELEMENT, AND METHOD FOR MANUFACTURING NONVOLATILE SEMICONDUCTOR MEMORY DEVICE

(71) Applicant: KABUSHIKI KAISHA TOSHIBA, Minato-ku (JP)

(72) Inventors: Takahiro Hirai, Mie-Ken (JP); Masaru Kito, Mei-Ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 121 days.

(21) Appl. No.: 13/971,274

(22) Filed: Aug. 20, 2013

(65) Prior Publication Data

US 2014/0284688 A1  Sep. 25, 2014

(30) Foreign Application Priority Data

Mar. 25, 2013 (JP) ................. 2013-063003

(51) Int. Cl.
*H01L 29/792* (2006.01)
*H01L 29/66* (2006.01)
(Continued)

(52) U.S. Cl.
CPC .......... *H01L 29/66833* (2013.01); *G11C 11/24* (2013.01); *H01L 27/11573* (2013.01); *H01L 27/11582* (2013.01); *H01L 28/91* (2013.01); *H01L 29/7926* (2013.01)

(58) Field of Classification Search
CPC .............. G11C 11/24; H01L 27/11573; H01L 27/11582; H01L 29/7926

USPC ................... 257/324, 532; 438/287
See application file for complete search history.

(56) References Cited

U.S. PATENT DOCUMENTS

| 7,936,004 B2 | 5/2011 | Kito et al. |
| 8,431,969 B2 | 4/2013 | Kim et al. |

(Continued)

FOREIGN PATENT DOCUMENTS

| JP | 2007-266143 A | 10/2007 |
| JP | 2009-224565 | 10/2009 |

(Continued)

OTHER PUBLICATIONS

Office Action issued May 20, 2015 in Japanese Patent Application No. 2013-063003 (with English translation).

*Primary Examiner* — Long K Tran
(74) *Attorney, Agent, or Firm* — Oblon, McClelland, Maier & Neustadt, L.L.P.

(57) ABSTRACT

According to one embodiment, a nonvolatile semiconductor memory device includes a memory element region and a capacitance element region. The capacitance region including: a second stacked body, each of a plurality of second electrode layers and each of a plurality of second insulating layers being stacked alternately; a plurality of conductive layers; and a second insulating film provided between each of the plurality of conductive layers and each of the plurality of second electrode layers. In the capacitance element region, a first capacitor is made of one of the plurality of second insulating layers and a pair of the second electrode layers sandwiching the one of the plurality of second insulating layers, and a second capacitor is made of the second insulating film, and one of the plurality of second electrode layers and one of the plurality of conductive layers sandwiching the second insulating film.

10 Claims, 12 Drawing Sheets

(51) Int. Cl.
  *G11C 11/24*    (2006.01)
  *H01L 27/115*   (2006.01)
  *H01L 49/02*    (2006.01)

(56) References Cited

U.S. PATENT DOCUMENTS

2007/0252201 A1   11/2007   Kito et al.
2011/0204420 A1   8/2011    Kim et al.
2011/0233722 A1*  9/2011    Liang et al. .................. 257/532
2011/0284947 A1   11/2011   Kito et al.
2011/0287597 A1   11/2011   Kito et al.
2012/0068354 A1*  3/2012    Tanaka et al. ................ 257/774

FOREIGN PATENT DOCUMENTS

JP   2011-29586 A    2/2011
JP   2011-171735 A   9/2011

* cited by examiner

C1*C2/(C1+C2)

US 9,190,499 B2

NONVOLATILE SEMICONDUCTOR MEMORY DEVICE, CAPACITANCE ELEMENT, AND METHOD FOR MANUFACTURING NONVOLATILE SEMICONDUCTOR MEMORY DEVICE

CROSS-REFERENCE TO RELATED APPLICATIONS

This application is based upon and claims the benefit of priority from Japanese Patent Application No. 2013-063003, filed on Mar. 25, 2013; the entire contents of which are incorporated herein by reference.

FIELD

Embodiments described herein relate generally to a nonvolatile semiconductor memory device, a capacitance element, and a method for manufacturing a nonvolatile semiconductor memory device.

BACKGROUND

A three-dimensional nonvolatile semiconductor memory device is formed as follows. A plurality of electrode layers as control gates are stacked into a stacked body. A memory hole is formed in the stacked body. A memory film is formed on the sidewall of this memory hole. Furthermore, a channel body layer is formed inside the memory film. This kind of nonvolatile semiconductor memory device includes a memory string including the channel body layer.

This kind of nonvolatile semiconductor memory device, like other semiconductor devices, requires a capacitance element as a power supply or protective element and the like. In the context of the miniaturization of nonvolatile semiconductor memory devices, increase in the design flexibility of the capacitance element is desired.

DETAILED DESCRIPTION

Figure 1:
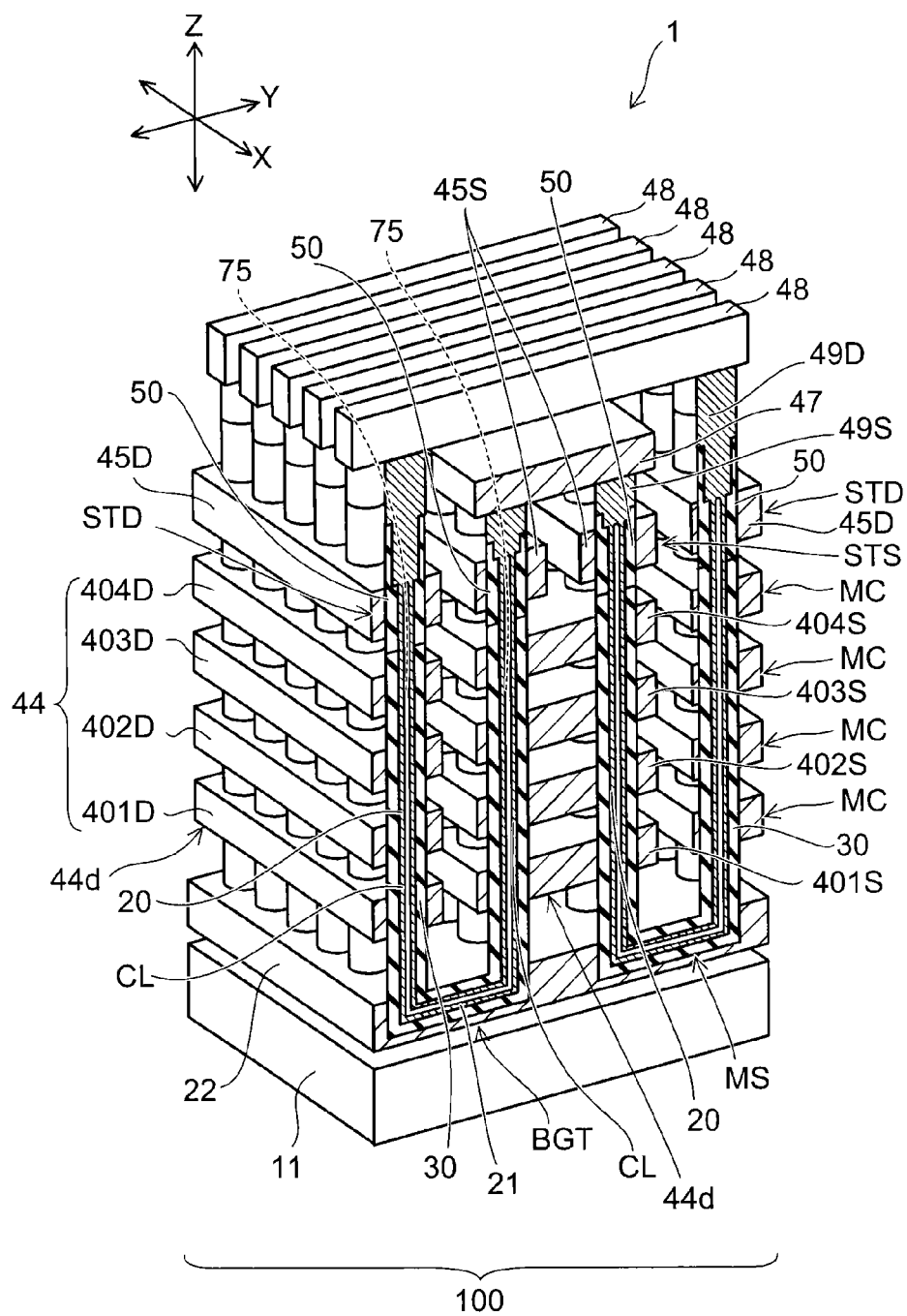
FIG. 1 is a schematic perspective view showing a memory cell array in a nonvolatile semiconductor memory device according to this embodiment.

In general, according to one embodiment, a nonvolatile semiconductor memory device includes a foundation layer; and a memory element region and a capacitance element region provided on the foundation layer. The memory element region including: a first stacked body provided on the foundation layer, each of a plurality of first electrode layers and each of a plurality of first insulating layers being stacked alternately in the first stacked body; a select gate electrode provided on the first stacked body; a semiconductor layer extending from an upper end of the select gate electrode to a lower end of the first stacked body; a first insulating film provided between the semiconductor layer and each of the plurality of first electrode layers; and a gate insulating film provided between the select gate electrode and the semiconductor layer. The capacitance element region including: a second stacked body provided on the foundation layer, each of a plurality of second electrode layers and each of a plurality of second insulating layers being stacked alternately in the second stacked body; a plurality of conductive layers extending from an upper end of the second stacked body to a lower end of the second stacked body; and a second insulating film provided between each of the plurality of conductive layers and each of the plurality of second electrode layers. And a first capacitor and a second capacitor are provided in the capacitance element region. The first capacitor is made of one of the plurality of second insulating layers and a pair of the second electrode layers sandwiching the one of the plurality of second insulating layers, and the second capacitor is made of the second insulating film, and one of the plurality of second electrode layers and one of the plurality of conductive layers sandwiching the second insulating film.

Embodiments will now be described with reference to the drawings. In the following description, like members are labeled with like reference numerals. The description of the members once described is omitted appropriately.

First, an overview of the structure of a nonvolatile semiconductor memory device 1 according to an embodiment is described.

FIG. 1 is a schematic perspective view showing a memory cell array in the nonvolatile semiconductor memory device according to this embodiment. The memory cell array is located in a memory element region 100 of the nonvolatile semiconductor memory device 1.

In FIG. 1, insulating portions other than the insulating film formed on the inner wall of the memory hole 75 are not shown. The nonvolatile semiconductor memory device 1 is a three-dimensionally stacked nonvolatile semiconductor memory device.

In FIG. 1, for convenience of description, an XYZ orthogonal coordinate system is introduced. In this coordinate system, two directions parallel to the major surface of the foundation layer 11 and orthogonal to each other are referred to as X direction and Y direction. The direction orthogonal to both these X and Y directions is referred to as Z direction.

The nonvolatile semiconductor memory device 1 according to this embodiment is a nonvolatile semiconductor memory device capable of electrically and freely erasing/writing data and retaining its memory content even when powered off.

In the memory cell array of the nonvolatile semiconductor memory device 1, on a foundation layer 11, a semiconductor layer 22 (back gate layer) is provided via an insulating layer, not shown. The foundation layer 11 includes a semiconductor substrate (e.g., silicon substrate), an insulating layer (e.g., $SiO_2$ layer), and circuits and the like. For instance, in the foundation layer 11, active elements such as transistors, and passive elements such as resistors and capacitors are provided. The semiconductor layer 22 is e.g. a silicon (Si) layer doped with an impurity element such as boron (B).

On the semiconductor layer 22, drain side electrode layers 401D, 402D, 403D, 404D and source side electrode layers 401S, 402S, 403S, 404S are stacked. In the Z direction, between these electrode layers, an insulating layer 42 (first insulating layer) is provided (not shown in FIG. 1, see FIG. 2). The material of the insulating layer 42 includes such as silicon oxide ($SiO_2$) and silicon nitride ($Si_3N_4$).

The electrode layer 401D and the electrode layer 401S are provided at the same level and represent first lowest electrode layers. The electrode layer 402D and the electrode layer 402S are provided at the same level and represent second lowest electrode layers. The electrode layer 403D and the electrode layer 403S are provided at the same level and represent third lowest electrode layers. The electrode layer 404D and the electrode layer 404S are provided at the same level and represent fourth lowest electrode layers.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An insulating layer, not shown, is provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, 404D are provided between the semiconductor layer 22 and a drain side select gate electrode 45D. The electrode layers 401S, 402S, 403S, 404S are provided between the semiconductor layer 22 and a source side select gate electrode 45S.

In the following description, the electrode layers 401D, 402D, 403D, 404D, 401S, 402S, 403S, 404S may also be simply referred to as electrode layers 40 (first electrode layers). The number of electrode layers 40 is arbitrary, and not limited to four layers illustrated in this embodiment. Furthermore, the electrode layers 40 and the insulating layers 42 are collectively referred to as a stacked body 44 (first stacked body). The lower surface of the first electrode layer 401D (or electrode layer 401S) constitutes the lower end 44d of the stacked body 44. The electrode layer 40 is e.g. a conductive silicon layer doped with an impurity element such as boron (B).

On the electrode layer 404D, a drain side select gate electrode 45D is provided via an insulating layer, not shown. The drain side select gate electrode 45D is e.g. a conductive silicon layer doped with impurity such as boron (B).

On the electrode layer 404S, a source side select gate electrode 45S is provided via an insulating layer, not shown. The source side select gate electrode 45S is e.g. a conductive silicon layer doped with impurity such as boron (B).

The drain side select gate electrode 45D and the source side select gate electrode 45S are divided in the Y direction. The drain side select gate electrode 45D and the source side select gate electrode 45S may also be simply referred to as select gate electrode 45 without distinction.

On the source side select gate electrode 45S, a source line 47 is provided via an insulating layer, not shown. The source line 47 is connected through a via 49S to one end of a pair of channel body layers 20 (also referred to as semiconductor layers or conductive layers). The source line 47 is a metal wiring, or a conductive silicon layer doped with impurity.

On the drain side select gate electrode 45D and the source line 47, a plurality of bit lines 48 are provided via an insulating layer, not shown. The bit line 48 is e.g. a metal wiring, or a conductive silicon layer doped with impurity. The bit line 48 is connected through a via 49D to the other end of the pair of channel body layers 20. The bit line 48 extends in the Y direction. The via 49S and the via 49D may also be simply denoted as via 49 without distinction. The material of the via 49 is e.g. tungsten (W).

In the semiconductor layer 22 and the stacked body 44, a plurality of U-shaped memory holes 75 are provided. For instance, in the electrode layers 401D-404D and the drain side select gate electrode 45D, holes penetrating therethrough and extending in the Z direction are formed. In the electrode layers 401S-404S and the source side select gate electrode 45S, holes penetrating therethrough and extending in the Z direction are formed. A pair of the holes extending in the Z direction are linked via the semiconductor layer 22 to constitute a U-shaped memory hole 75. Here, besides the U-shaped memory hole, a straight memory hole is also encompassed within the scope of this embodiment (described later).

Inside the memory hole 75, a channel body layer 20 is provided in a U-shape. The channel body layer 20 is e.g. a silicon-containing layer. This silicon refers to e.g. polysilicon, amorphous silicon and the like. Alternatively, the material of the channel body layer 20 may be tungsten (W). A memory film 30 (first insulating film) is provided between the channel body layer 20 and the inner wall of the memory hole 75.

A gate insulating film 50 is provided between the channel body layer 20 and the drain side select gate electrode 45D. A gate insulating film 50 is provided between the channel body layer 20 and the source side select gate electrode 45S.

Here, the embodiment is not limited to the structure in which the inside of the memory hole 75 is entirely filled with the channel body layer 20. As an alternative structure, the channel body layer 20 may be formed so as to leave a void portion on the central axis side of the memory hole 75, and the inside void portion may be filled with insulator.

The drain side select gate electrode 45D, the channel body layer 20, and the gate insulating film 50 therebetween constitute a drain side select transistor STD. The channel body layer 20 above the drain side select transistor STD is electrically connected to a bit line 48.

The source side select gate electrode 45S, the channel body layer 20, and the gate insulating film 50 therebetween constitute a source side select transistor STS. The channel body layer 20 above the source side select transistor STS is electrically connected to a source line 47.

The drain side select transistor STD and the source side select transistor STS are cylindrical transistors.

The semiconductor layer 22, the channel body layer 20 provided in the semiconductor layer 22, and the memory film 30 constitute a back gate layer transistor BGT.

A plurality of memory cells MC with the electrode layers 404D-401D serving as control gates are provided between the drain side select transistor STD and the back gate layer transistor BGT. Likewise, a plurality of memory cells MC with the electrode layers 401S-404S serving as control gates are provided also between the back gate layer transistor BGT and the source side select transistor STS.

The plurality of memory cells MC, the drain side select transistor STD, the back gate layer transistor BGT, and the source side select transistor STS are series connected via the channel body layer to constitute one U-shaped memory string (NAND string) MS.

One memory string MS includes a pair of columnar portions CL extending in the stacking direction of the stacked body 44 including a plurality of electrode layers 40, and a linking portion 21 embedded in the semiconductor layer 22 and linking the pair of columnar portions CL. The linking portion 21 includes a channel body layer 20. A plurality of such memory strings MS are arranged in the X direction and the Y direction. Thus, a plurality of memory cells are provided three-dimensionally in the X direction, the Y direction, and the Z direction.

The plurality of memory strings MS are provided on a memory cell array region in the foundation layer 11. Around the periphery, for instance, of the memory cell array region in the foundation layer 11, a peripheral circuit for controlling the memory cell array is provided.

The nonvolatile semiconductor memory device 1 includes channel body layers 20 penetrating through the stacked electrode layers 40. The channel body layer 20 serves as a vertical semiconductor plug electrode. In the nonvolatile semiconductor memory device 1, the cross point of the electrode layer 40 and the channel body layer 20 is used as a memory element. In the nonvolatile semiconductor memory device 1, the lower ends of a pair of channel body layers 20 are connected by the linking portion 21. By the control of the select gate electrode 45 formed in each upper portion of the pair of channel body layers 20, a current is passed in the U-shaped semiconductor layer to read/erase data.

Figure 2:
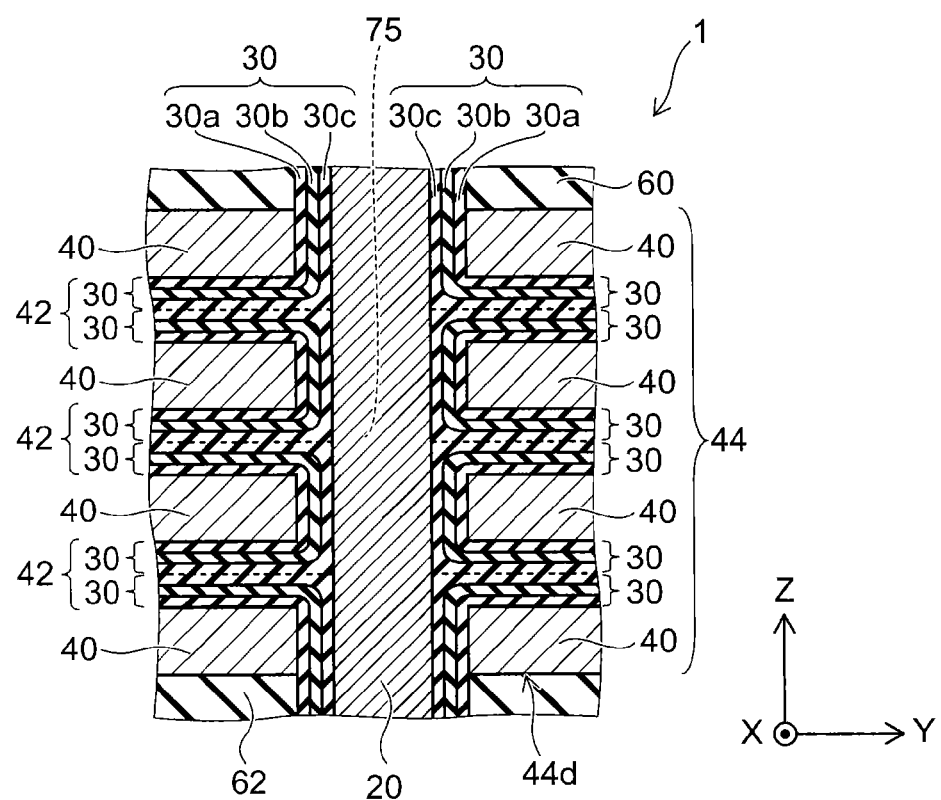
FIG. 2 is a schematic sectional view showing the memory cell section of the nonvolatile semiconductor memory device according to this embodiment.

FIG. 2 is a schematic sectional view showing the memory cell section of the nonvolatile semiconductor memory device according to this embodiment. The channel body layer 20 shown in FIG. 2 is one of the pair of channel body layers 20 described above.

The nonvolatile semiconductor memory device 1 includes a foundation layer 11, a stacked body 44, a channel body layer 20, and a memory film 30. The stacked body 44 is provided on the aforementioned foundation layer 11 (not shown in FIG. 2, see FIG. 1) via an insulating layer 62. In the stacked body 44, a plurality of electrode layers 40 and a plurality of insulating layers 42 are stacked alternately one by one. In other words, each of the plurality of electrode layers 40 and each of the plurality of insulating layers 42 are stacked alternately. The insulating layer 62 includes silicon oxide ($SiO_2$). On the stacked body 44, an interlayer insulating layer 60 is provided. The interlayer insulating layer 60 includes silicon oxide ($SiO_2$).

The memory film 30 is provided between the channel body layer 20 and each of the plurality of electrode layers 40. The memory film 30 is provided also between the channel body layer 20 and each of the plurality of insulating layers 42. The memory film 30 has a multilayer structure.

In the memory film 30, sequentially from the electrode layer 40 side toward the channel body layer 20, an oxide film 30a, a nitride film 30b, and an oxide film 30c are arranged. The nitride film 30b is e.g. a film including silicon nitride ($Si_3N_4$). The oxide film 30a, 30c is e.g. a film including silicon oxide ($SiO_2$). The memory film 30 has e.g. an ONO (oxide-nitride-oxide) structure in which a nitride film is sandwiched between a pair of oxide films. The insulating layer 42 sandwiched between the vertically adjacent electrode layers 40 is e.g. a stacked film including two ONO structures. Here, the structure of the memory film 30 and the structure of the insulating layer 42 are not limited to those only including the ONO structure. For instance, the structure of the memory film 30 includes such as an ONONO structure, a multilayer film structure including more layers than this ONONO structure, and a multilayer film structure which constitutes a multilayer film as a whole but is monolayer in the portion having the memory function. The structure of the insulating layer 42 may include such as an ONONO structure, a multilayer film structure including more layers than this ONONO structure, and a multilayer film structure which constitutes a multilayer film as a whole but is monolayer in the portion having the memory function.

The channel body layer 20 functions as a channel in a transistor constituting a memory cell. The electrode layer 40 functions as a control gate. The memory film 30 functions as a memory film of the nonvolatile semiconductor memory device 1. The nitride film 30b functions as a data memory layer for accumulating charge injected from the channel body layer 20.

Thus, in the memory element region 100 of the nonvolatile semiconductor memory device 1, a stacked body 44 is provided on the foundation layer 11. In the stacked body 44, a plurality of electrode layers 40 and a plurality of insulating layers 42 are stacked alternately one by one. Each of the plurality of electrode layers 40 and each of the plurality of insulating layers 42 are stacked alternately. On the stacked body 44, a select gate electrode 45 is provided. A channel body layer 20 extends from the upper end of the select gate electrode 45 to the lower end of the stacked body 44. A memory film 30 is provided between the channel body layer 20 and each of the plurality of electrode layers 40. A gate insulating film 50 is provided between the select gate electrode 45 and the channel body layer 20.

Besides the memory element region 100, the nonvolatile semiconductor memory device 1 includes a capacitance element region. The capacitance element region is provided on the foundation layer 11.

Figure 3A:
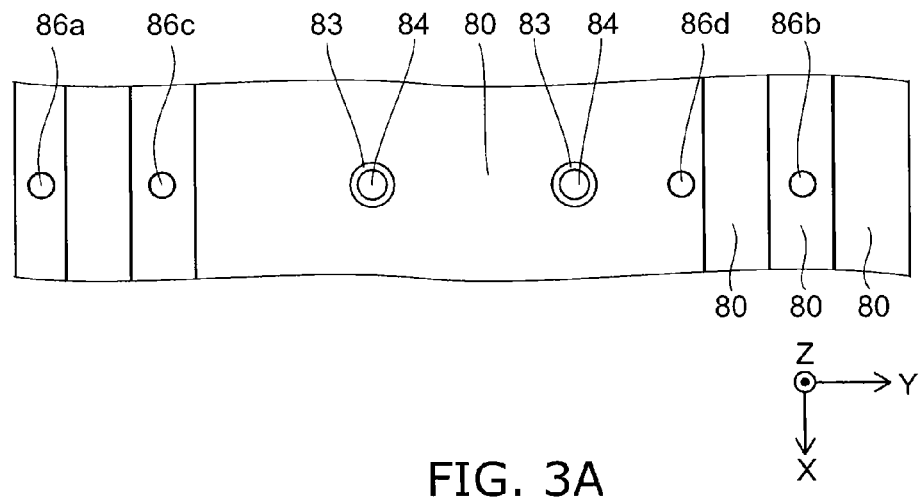
FIGS. 3A and 3B are schematic views showing the capacitance element region of the nonvolatile semiconductor memory device according to this embodiment.
Figure 3B:
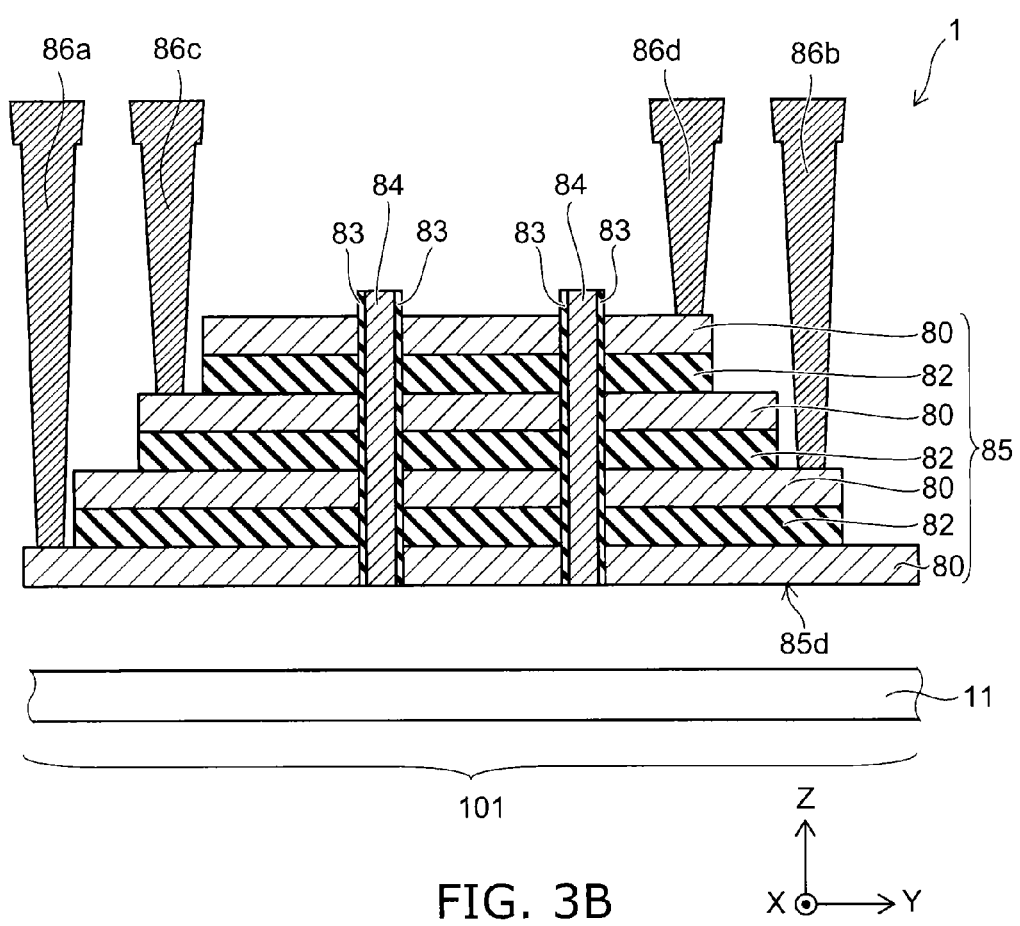

FIGS. 3A and 3B are schematic views showing the capacitance element region of the nonvolatile semiconductor memory device according to this embodiment. FIG. 3A is a schematic plan view of the capacitance element region. FIG. 3B is a schematic sectional view of the capacitance element region.

The capacitance element region 101 includes a stacked body 85 (second stacked body), a conductive layer 84 (or also referred to as semiconductor layer 84), and an insulating film 83 (second insulating film). The capacitance element region 101 includes a capacitance element including the stacked body 85, the conductive layer 84, and the insulating film 83.

In the stacked body 85 of the capacitance element region 101, a plurality of electrode layers 80 (second electrode layers) and a plurality of insulating layers 82 (second insulating layers) are stacked alternately one by one. Each of the plurality of electrode layers 80 (second electrode layers) and each of the plurality of insulating layers 82 (second insulating layers) are stacked alternately. Each of the plurality of insulating layers 82 is sandwiched between a pair of electrode layers 80. In this embodiment, the number of electrode layers 80 is four, which is equal to the number of electrode layers 40 in FIG. 2. However, the number of electrode layers 80 is not limited thereto.

The conductive layer 84 extends from the upper end 85u of the stacked body 85 to the lower end 85d of the stacked body 85. The insulating film 83 is provided between the conductive layer 84 and each of the plurality of electrode layers 80. Furthermore, a contact electrode is connected to one of the pair of electrode layers 80, and another contact electrode is connected to the other of the pair of electrode layers 80. For instance, a contact electrode 86a is connected to the first lowest electrode layer 80 of the stacked body 85. A contact electrode 86b is connected to the second lowest electrode layer 80 of the stacked body 85. A contact electrode 86c is connected to the third lowest electrode layer 80 of the stacked body 85. A contact electrode 86d is connected to the fourth lowest electrode layer 80 of the stacked body 85.

A plurality of electrode layers 80 stacked at the odd-numbered levels from the bottom of the stacked body 85 can be applied with a first potential through the contact electrodes. A plurality of electrode layers 80 stacked at the even-numbered levels from the bottom of the stacked body 85 can be applied with a second potential different from the first potential through the contact electrodes. That is, every other one of the plurality of electrode layers 80 is applied with the same potential from the bottom toward the top.

The capacitance element is described in more detail.

Figure 4A:
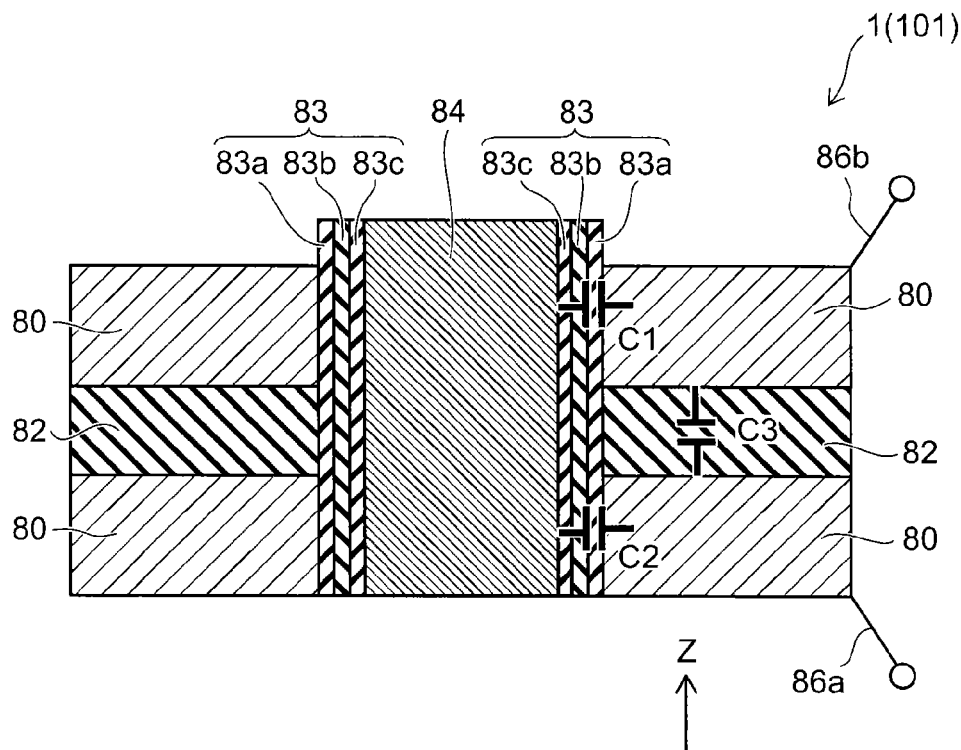
FIGS. 4A and 4B are schematic views showing the capacitance element region of the nonvolatile semiconductor memory device according to this embodiment.
Figure 4B:
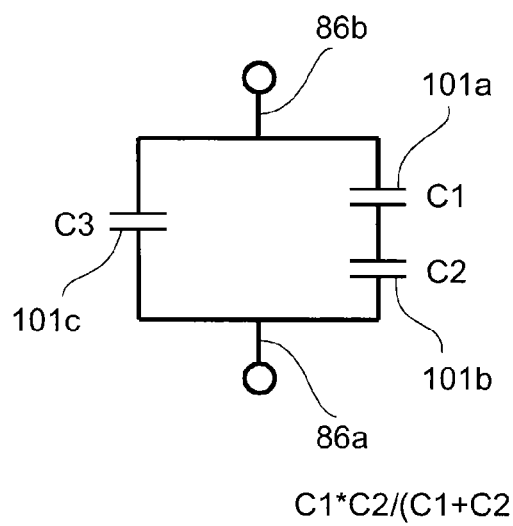

FIGS. 4A and 4B are schematic views showing the capacitance element region of the nonvolatile semiconductor memory device according to this embodiment. FIG. 4A is a schematic sectional view of the capacitance element region partly enlarging FIG. 3B. FIG. 4B shows an equivalent circuit of FIG. 4A. By way of example, FIG. 4B shows the first lowest electrode layer 80 and the second lowest electrode layer 80 of the stacked body 85.

In the capacitance element region 101, one of the plurality of insulating layers 82 and a pair of electrode layers 80 sandwiching this insulating layer 82 constitute a capacitor 101c (first capacitor). Furthermore, the insulating film 83 and one of the plurality of electrode layers 80 and one of the plurality of conductive layers 84 sandwiching this insulating film 83 constitute capacitors 101a, 101b (second capacitors). The capacitance of the capacitor 101a is denoted by C1. The capacitance of the capacitor 101b is denoted by C2. The capacitance of the capacitor 101c is denoted by C3. The capacitors 101c, 101a, 101b are each provided in a plurality.

The capacitor 101c is connected between the contact electrode 86a and the contact electrode 86b. Two capacitors 101a, 101b connected in series via one of the plurality of conductive layers 84 are connected between the contact electrode 86a and the contact electrode 86b. That is, between the contact electrode 86a and the contact electrode 86b, two capacitors 101a, 101b are series connected. Between the contact electrode 86a and the contact electrode 86b, the capacitor 101c and the two capacitors 101a, 101b are parallel connected. Thus, the capacitance C between the contact electrode 86a and the contact electrode 86b can be expressed as C3+(C1×C2)/(C1+C2).

Here, the thickness of the aforementioned stacked body 44 is equal to the thickness of the stacked body 85. The number of stacked layers of the stacked body 44 is equal to the number of stacked layers of the stacked body 85. The material of each of the plurality of electrode layers 40 is identical to the material of each of the plurality of electrode layers 80. The material and stacked structure of the plurality of insulating layers 42 are identical to the material and stacked structure of the plurality of insulating layers 82. The material of the channel body layer 20 is identical to the material of the conductive layer 84.

The material of the memory film 30 is identical to the material of the insulating film 83. For instance, the insulating film 83 includes an oxide film 83a, a nitride film 83b, and an oxide film 83c. In the insulating film 83, sequentially from the electrode layer 80 side to the conductive layer 84 side, an oxide film 83a, a nitride film 83b, and an oxide film 83c are arranged. The nitride film 83b includes e.g. silicon nitride ($Si_3N_4$). The oxide film 83a, 83c includes e.g. silicon oxide ($SiO_2$). By way of example, the insulating film 83 and the insulating layer 82 have an ONO (oxide-nitride-oxide) structure in which a nitride film is sandwiched between a pair of oxide films. However, the thickness of the insulating film 83 is preferably thinner than the thickness of each of the plurality of insulating layers 82 (described later).

FIGS. 5 to 11 are schematic sectional views showing a process for manufacturing a nonvolatile semiconductor memory device according to this embodiment.

Unless otherwise specified, the method for forming each film and each layer described below is appropriately selected from CVD methods such as thermal CVD (chemical vapor deposition) and plasma CVD, sputtering method, ALD (atomic layer deposition) method, epitaxial growth method, and coating method such as spin coating method.

Figure 5:
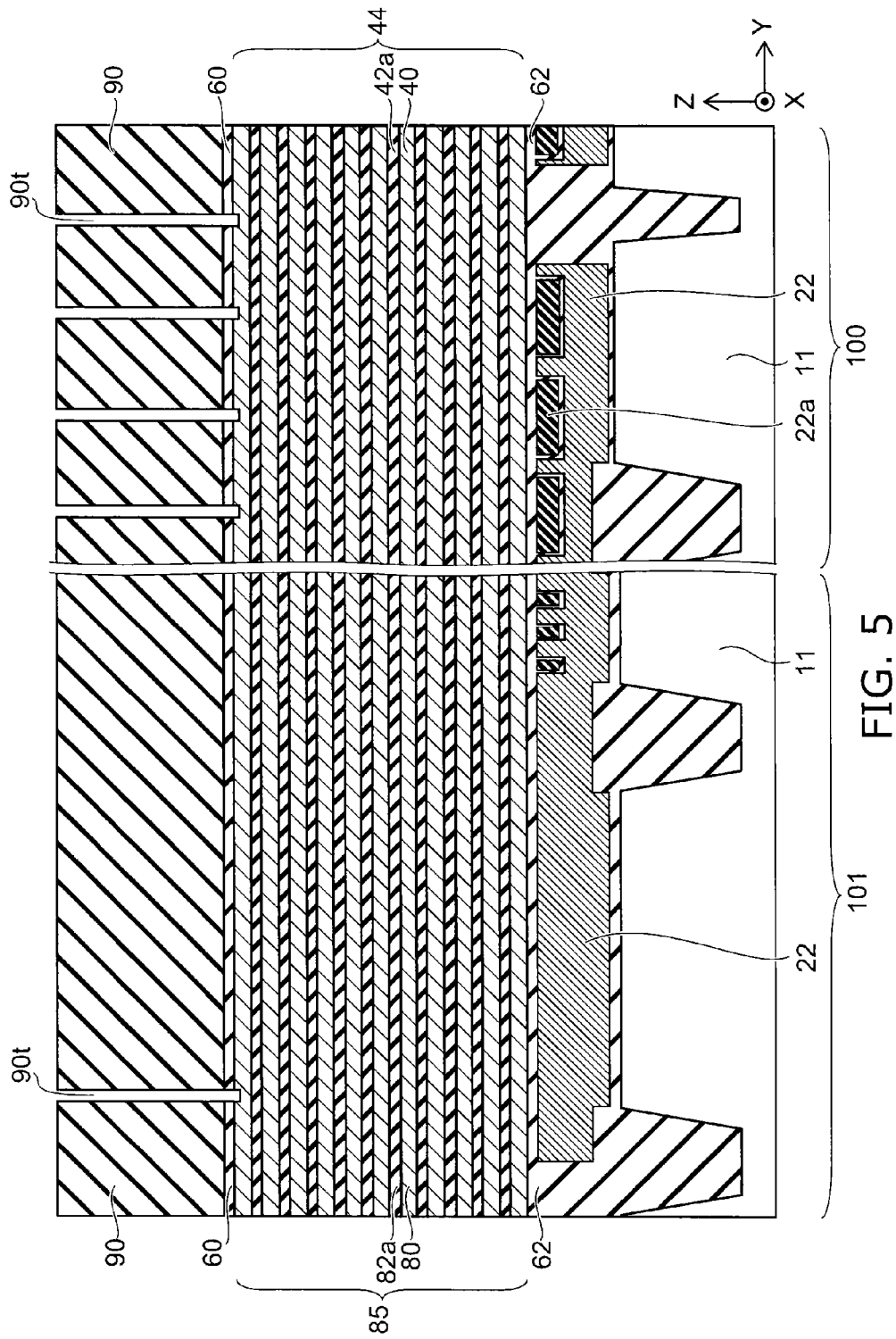
FIGS. 5 to 11 are schematic sectional views showing a process for manufacturing a nonvolatile semiconductor memory device according to this embodiment.

First, as shown in FIG. 5, in the memory element region 100, on a foundation layer 11, a semiconductor layer 22 is formed. Furthermore, on the semiconductor layer 22, a stacked body 44 is formed via an insulating layer 62. In the stacked body 44, a plurality of electrode layers 40 and a plurality of sacrificial layers (first intermediate layers) 42a are stacked alternately one by one. The electrode layer 40 is formed by ion implantation of an impurity element such as boron (B) into a silicon (Si) layer. In the semiconductor layer 22, a sacrificial layer 22a is formed. The material of the sacrificial layers 22a, 42a is non-doped silicon (Si).

In the capacitance element region 101, on the foundation layer 11, the semiconductor layer 22 is formed. Furthermore, on the semiconductor layer 22, a stacked body 85 is formed via the insulating layer 62. In the stacked body 85, a plurality of electrode layers 80 and a plurality of sacrificial layers (second intermediate layers) 82a are stacked alternately one by one. The electrode layer 80 is formed by ion implantation of an impurity element such as boron (B) into a silicon (Si) layer. The material of the sacrificial layer 82a is non-doped silicon (Si).

Next, on the stacked bodies 44, 85, an interlayer insulating layer 60 is formed. Furthermore, on the interlayer insulating layer 60, a mask 90 is patterned. In the mask 90, a trench 90t reaching the upper surface of the stacked body 44, 85 is provided. The trench 90t extends in the Z direction, and also extends in the X direction.

This mask 90 is used to perform RIE (reactive ion etching) on the stacked bodies 44, 85. After RIE, the mask 90 is removed. This state is shown in FIG. 6.

Figure 6:
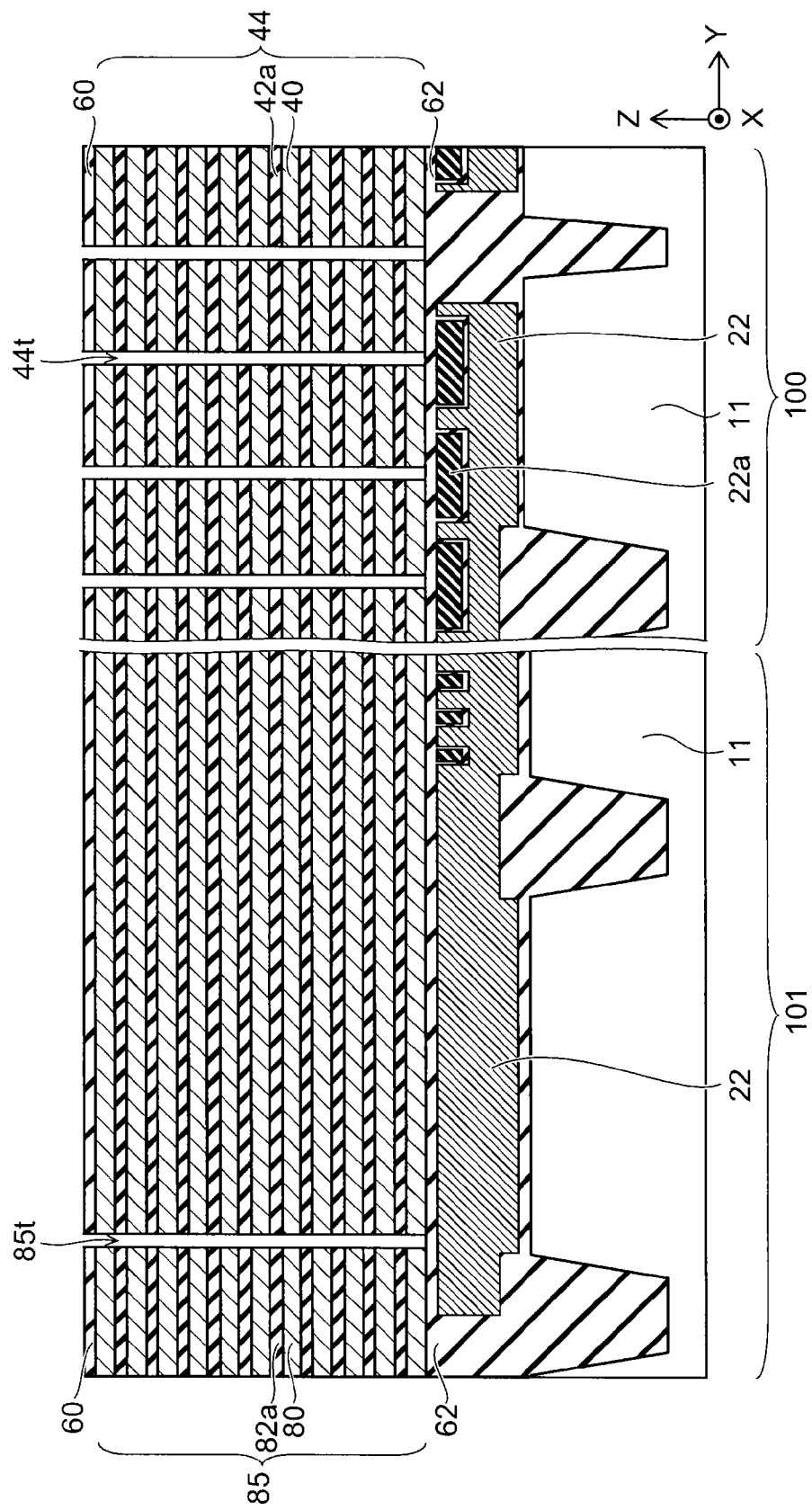

As shown in FIG. 6, in the stacked body 44, a trench 44t extending from the upper end to the lower end of the stacked body 44 is formed. In the stacked body 85, a trench 85t extending from the upper end to the lower end of the stacked body 85 is formed.

Figure 7:
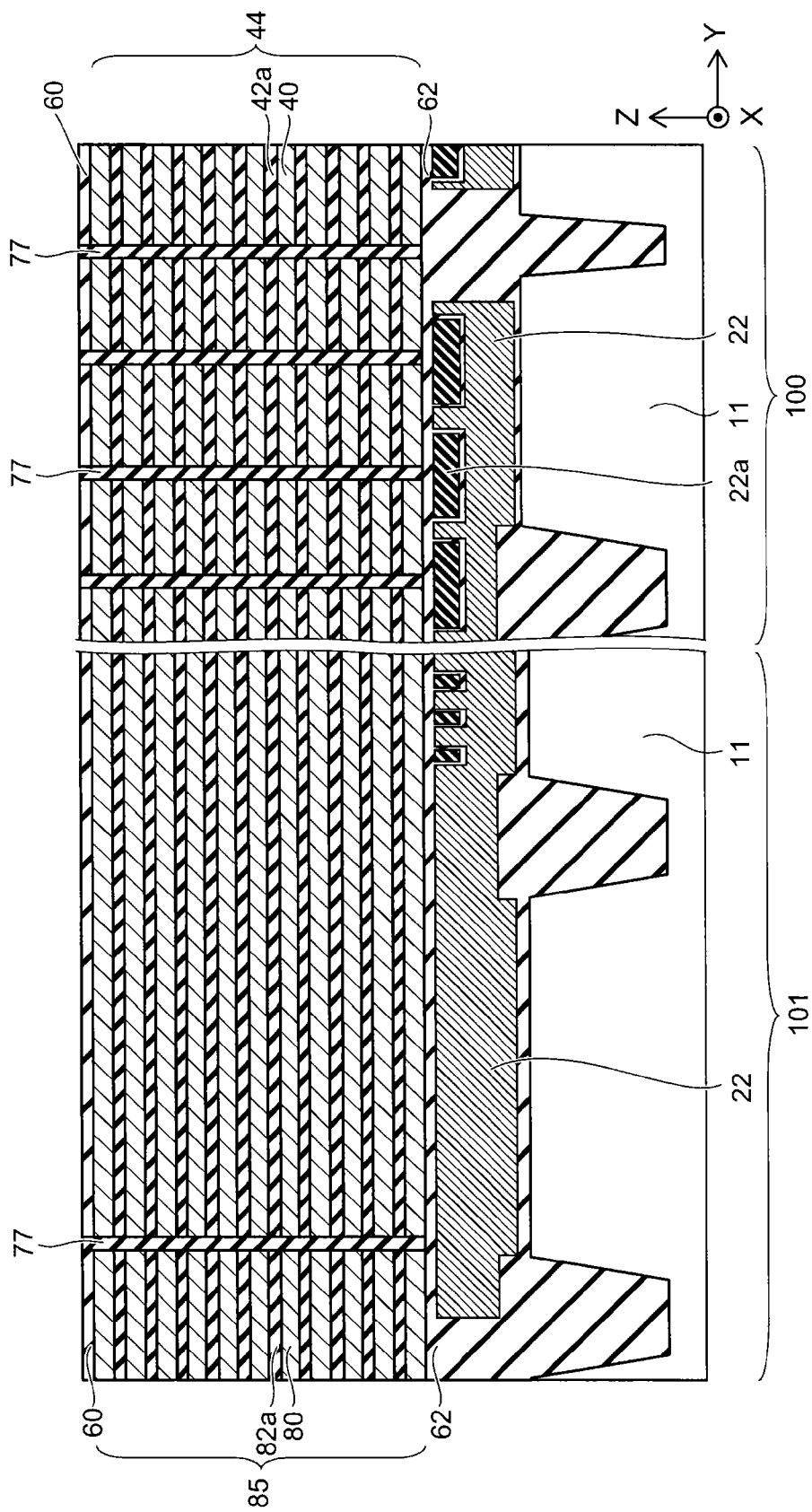

Next, as shown in FIG. 7, in the trench 44t, 85t, an insulating layer 77 is formed by e.g. ALD. In the memory element region 100, the insulating layer 77 is provided on the central portion of the sacrificial layer 22a. The insulating layer 77 is an insulating barrier such that the electrode layer 40 extending in the X and Y directions is insulated at required positions. The material of the insulating layer 77 is e.g. silicon nitride ($Si_3N_4$).

Figure 8:
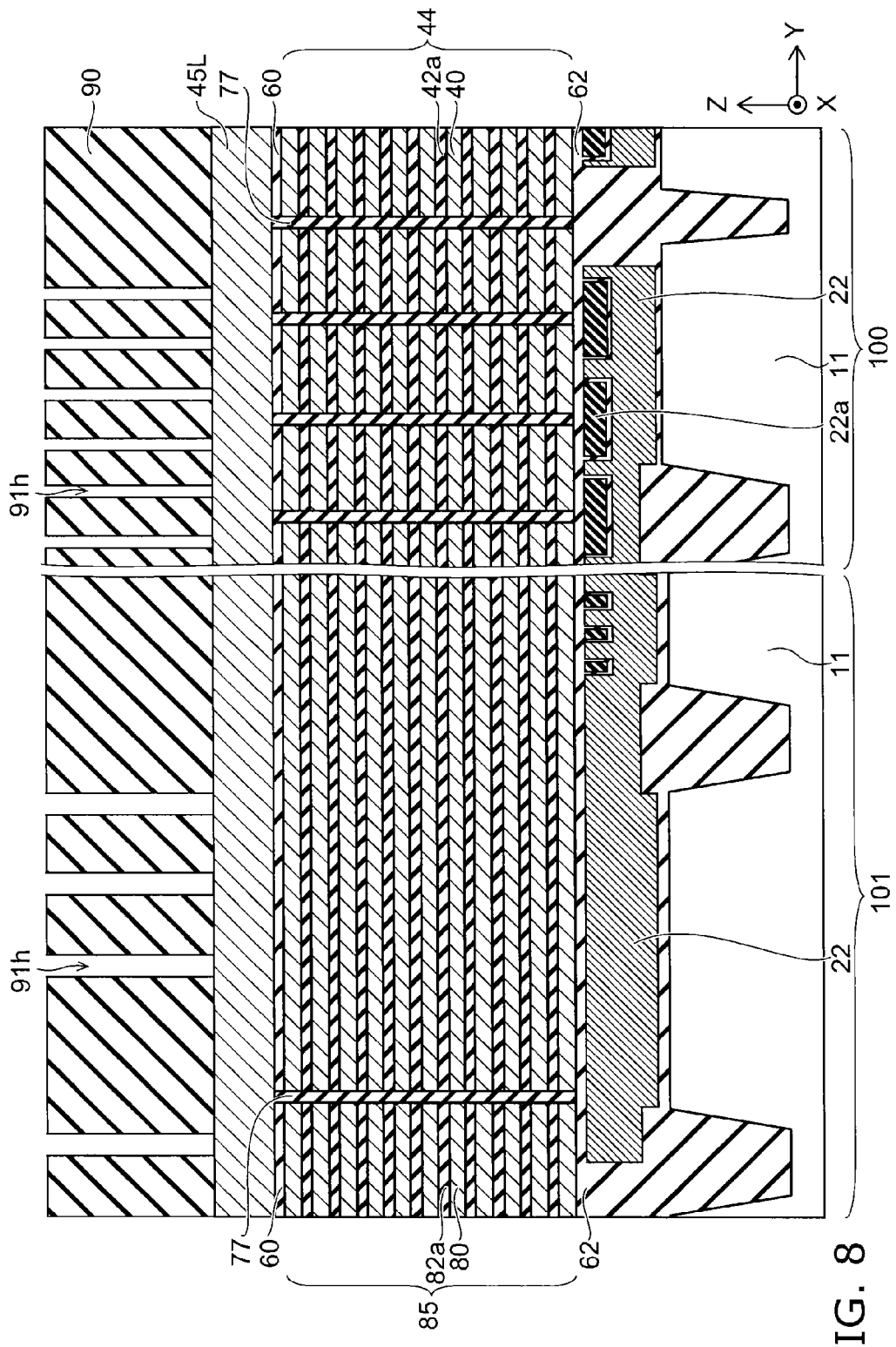

Next, as shown in FIG. 8, on the upper side of the stacked bodies 44, 85, a select gate electrode layer 45L is formed via the interlayer insulating layer 60. Furthermore, on the select gate electrode layer 45L, a mask 91 is patterned. In the mask 91, a hole 91h reaching the upper surface of the select gate electrode layer 45L is provided.

This mask 91 is used to perform RIE on the select gate electrode layer 45L and the stacked bodies 44, 85. After RIE, the mask 91 is removed. This state is shown in FIG. 9.

Figure 9:
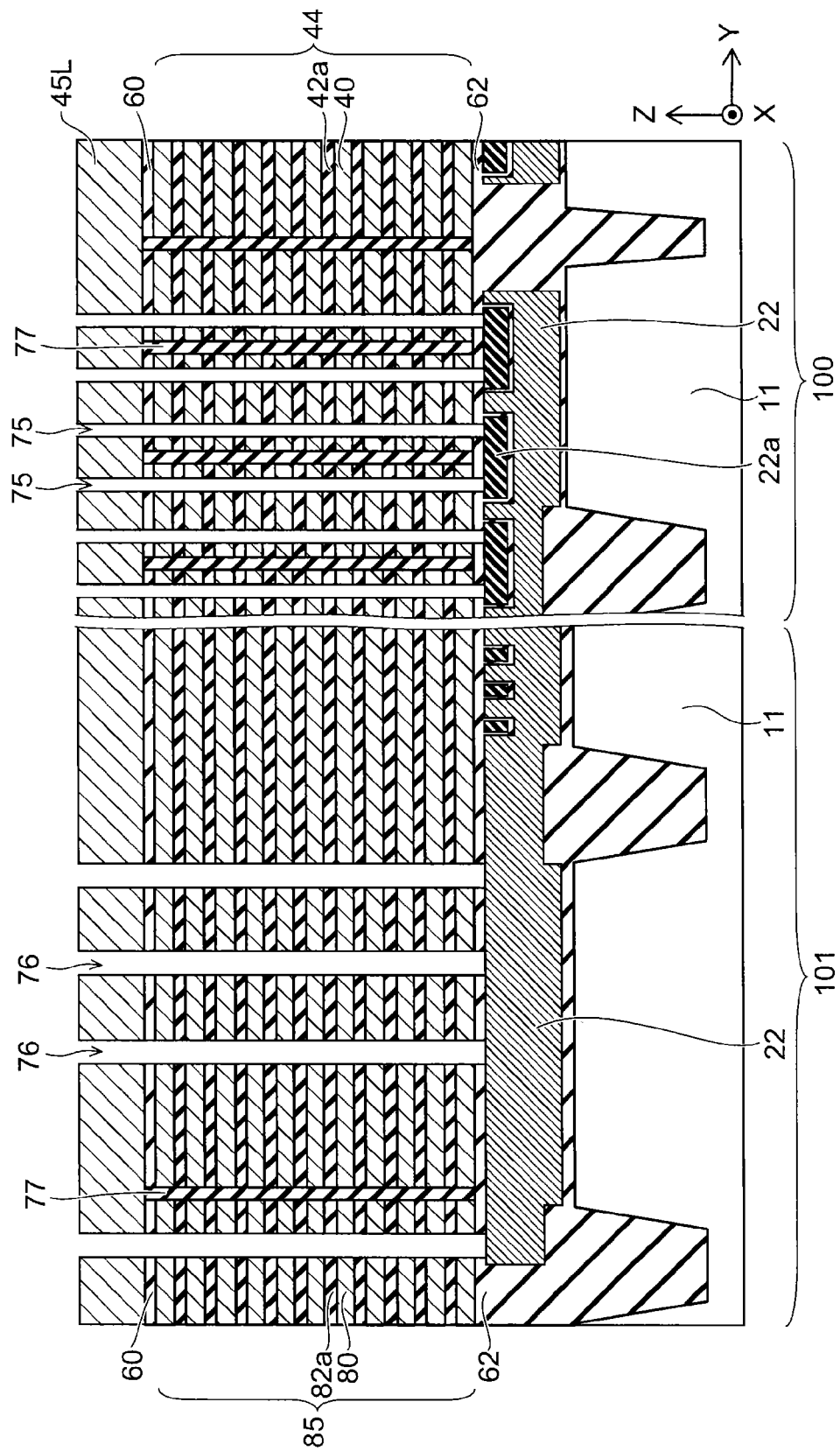

As shown in FIG. 9, in the memory element region 100, memory holes 75 (first holes) penetrating through the select gate electrode layer 45L and through the stacked body 44 in the stacking direction (Z direction) of the stacked body 44 are formed. For instance, a pair of memory holes 75 are formed on both sides of the insulating layer 77. The lower end of each of the pair of memory holes 75 reaches the sacrificial layer 22a.

In the capacitance element region 101, a plurality of holes 76 (second holes) penetrating through the stacked body 85 in the stacking direction (Z direction) of the stacked body 85 are formed.

The inner diameter of the memory hole 75 and the inner diameter of the hole 76 are e.g. 75-80 nm. Here, the inner diameter of the hole 76 corresponds to the outer diameter of the insulating film 83 (or memory film 30) described later. The spacing between the plurality of holes 76 is e.g. 130 nm.

Figure 10:
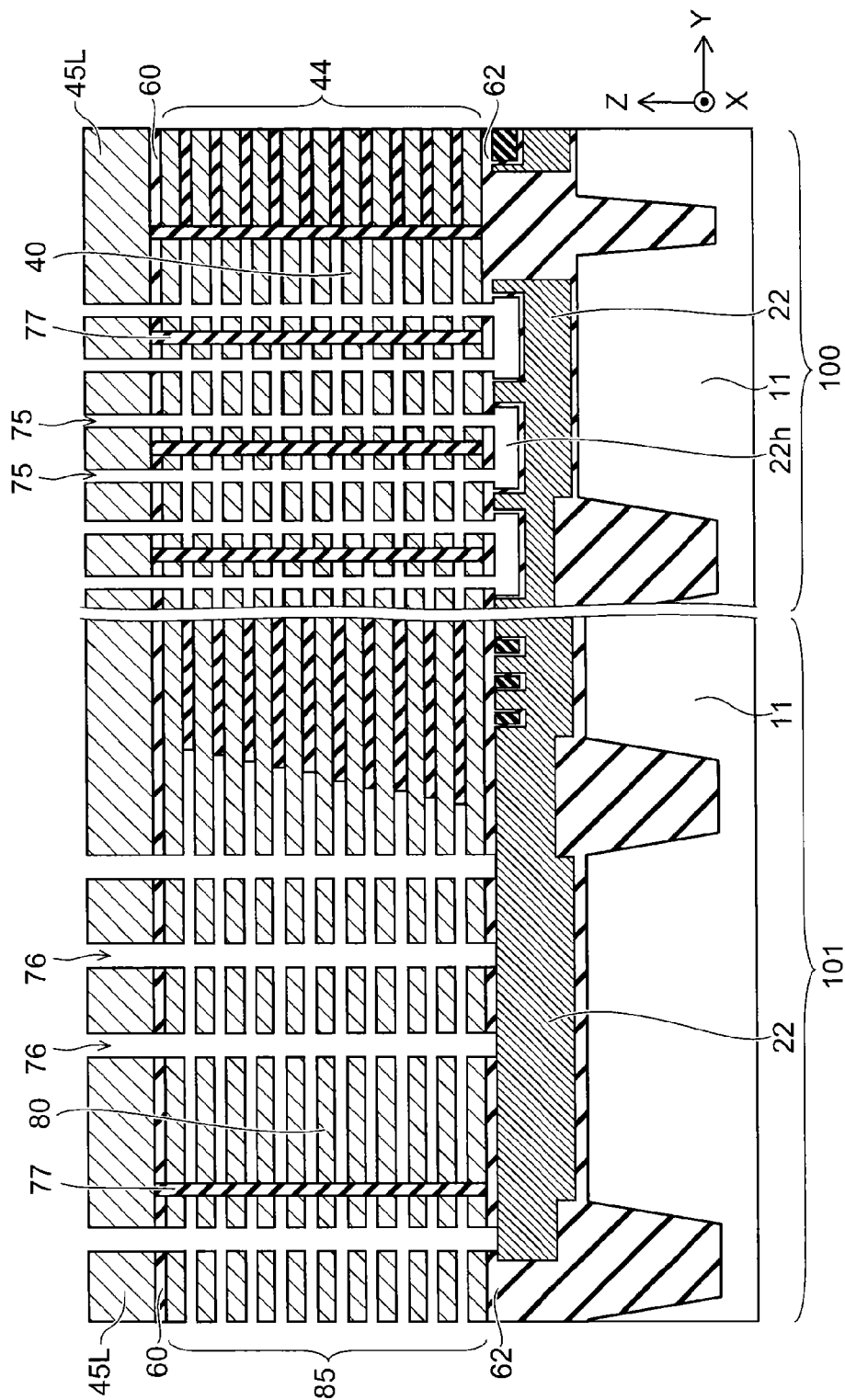

Next, as shown in FIG. 10, the plurality of sacrificial layers 42a and the sacrificial layer 22a are removed through each of the plurality of memory holes 75. Furthermore, the plurality of sacrificial layers 82a are removed through each of the plurality of holes 76. The removal of the sacrificial layers 22a, 42a, 82a is performed by injecting dilute hydrofluoric acid (DHF), alkaline chemicals or the like into the memory holes 75 and the holes 76 to dissolve the sacrificial layers 22a, 42a, 82a with the solution. After the sacrificial layers 42a, 82a are removed, the insulating layer 77 functions as a strut.

Figure 11:
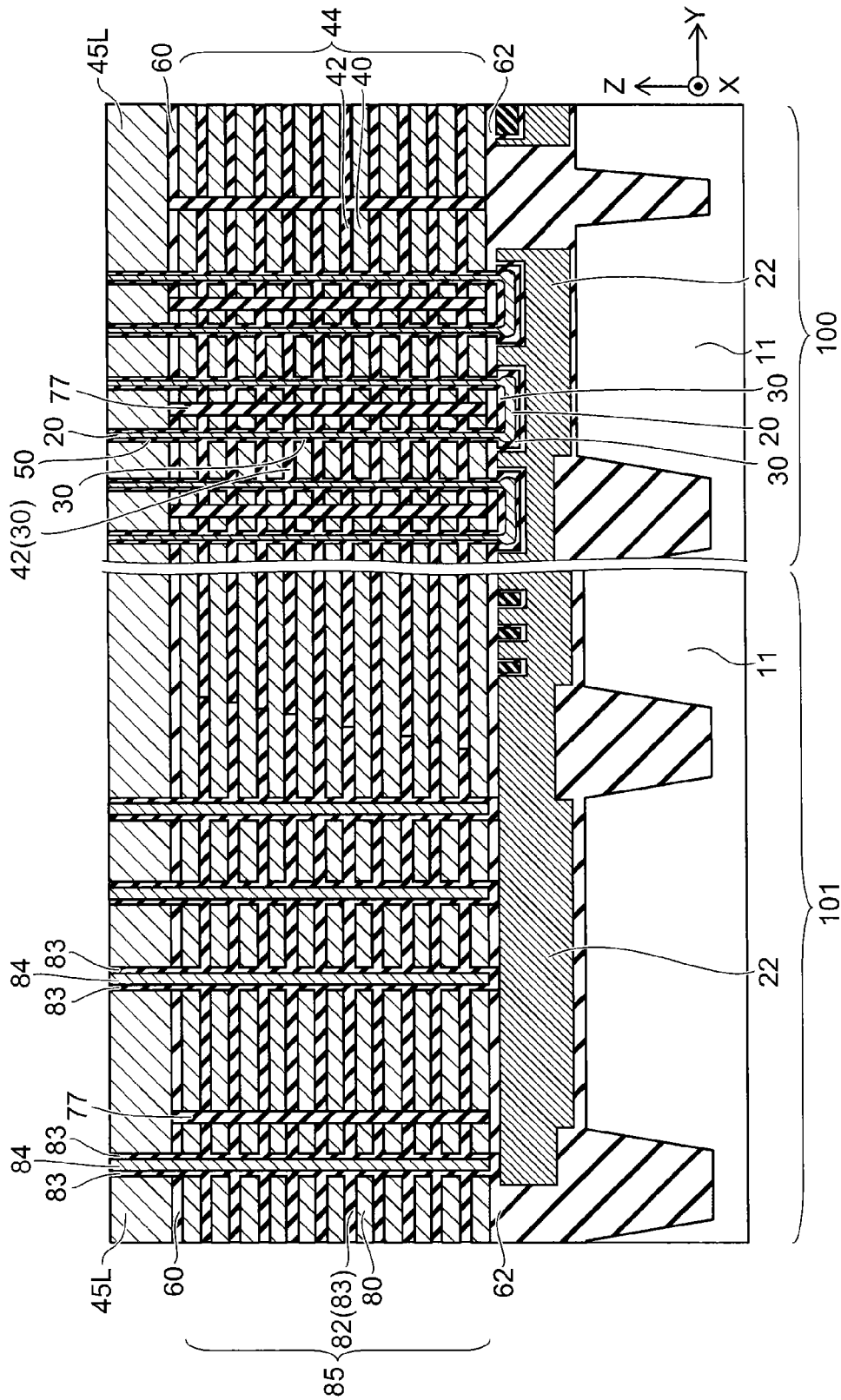

Next, as shown in FIG. 11, in the memory element region 100, a memory film 30 in contact with each of the plurality of electrode layers 40 and a gate insulating film 50 in contact with the select gate electrode layer 45L are formed in the memory hole 75. In the capacitance element region 101, an insulating film 83 in contact with each of the plurality of electrode layers 80 is formed in the hole 76. The film thickness of the insulating film 83 is e.g. 10 nm.

Furthermore, an insulating layer 42 is formed between the vertically adjacent electrode layers 40. Furthermore, an insulating layer 82 is formed between the vertically adjacent electrode layers 80. That is, a memory film 30 is formed between each adjacent pair of the plurality of electrode layers 40 to form an insulating layer 42. Furthermore, an insulating film 83 is formed between each adjacent pair of the plurality of electrode layers 80 to form an insulating layer 82.

At this stage, the stacked structure and material of the insulating layer 42 are identical to the stacked structure and material of the memory film 30. The stacked structure and material of the insulating layer 82 are identical to the stacked structure and material of the insulating film 83. This is because the memory film 30 and the insulating film 83 are inserted between the vertically adjacent electrode layers formed by removing the sacrificial layers 42a, 82a, respectively.

Next, in the memory element region 100, a channel body layer 20 in contact with the memory film 30 and the gate insulating film 50 is formed. In the capacitance element region 101, a conductive layer 84 in contact with the insulating film 83 is formed.

Subsequently, as shown in FIG. 1, the select gate electrode layer 45L is divided into gate electrodes 45. Furthermore, contact electrodes 86a-86d, source lines 47, bit lines 48 and the like are formed. In the capacitance element region 101, the select gate electrode layer 45L may be removed as necessary.

In this embodiment, in the memory element region 100 and the capacitance element region 101, the stacked bodies 44, 85 are simultaneously formed on the foundation layer 11 (FIG. 5).

In this embodiment, in the memory element region 100 and the capacitance element region 101, the trenches 44t, 85t are simultaneously formed in the stacked bodies 44, 85 (FIG. 6).

In this embodiment, in the memory element region 100 and the capacitance element region 101, the memory holes 75 and the holes 76 are simultaneously formed (FIG. 9).

In this embodiment, in the memory element region 100 and the capacitance element region 101, the plurality of sacrificial layers 42a and the plurality of sacrificial layers 82a are simultaneously removed (FIG. 10).

In this embodiment, in the memory element region 100 and the capacitance element region 101, the memory film 30, the gate insulating film 50, and the insulating film 83 are simultaneously formed (FIG. 11). Furthermore, the insulating layer 42 provided between the vertically adjacent electrode layers 40 and the insulating layer 82 provided between the vertically adjacent electrode layers 80 are simultaneously formed (FIG. 11). Furthermore, the channel body layer 20 and the conductive layer 84 are simultaneously formed (FIG. 11).

Thus, as described above, in the memory element region 100 and the capacitance element region 101, the materials of the respective members are made identical.

In the process illustrated in FIGS. 5 to 11, the memory element region 100 and the capacitance element region 101 are formed at the same timing. However, a manufacturing process in which the memory element region 100 and the capacitance element region 101 are formed in different steps is also encompassed within the scope of this embodiment.

Furthermore, FIGS. 5 to 11 illustrate what is called the replacement process. In the memory element region 100, by the replacement process, a sacrificial layer 42a is provided between the plurality of electrode layers 40, and after this sacrificial layer 42a is removed, an insulating layer 42 (memory film 30) is formed between the plurality of electrode layers 40. Likewise, in the capacitance element region 101, by the replacement process, a sacrificial layer 82a is provided between the plurality of electrode layers 80, and after this sacrificial layer 82a is removed, an insulating layer 82 (insulating film 83) is formed between the plurality of electrode layers 80.

In the memory element region 100, instead of this replacement process, a stacked body 44 with a plurality of electrode layers 40 and a plurality of insulating layers 42 arranged alternately one by one may be previously formed on the foundation layer 11, and a memory film 30 and a channel body layer 20 may be formed in this stacked body 44. In this case, the insulating layer 42 may be a monolayer silicon oxide layer. Likewise, in the capacitance element region 101, instead of the replacement process, a stacked body 85 with a plurality of electrode layers 80 and a plurality of insulating layers 82 arranged alternately one by one may be formed on the foundation layer 11, and an insulating film 83 and a conductive layer 84 may be formed in this stacked body 85. In this case, the insulating layer 82 may be a monolayer silicon oxide layer.

The memory element region 100 and the capacitance element region 101 may be formed on the same foundation layer 11, or may be formed on different foundation layers. The channel body layer 20 (or conductive layer 84) does not need to be completely embedded in the memory hole 75 (or hole 76), but a space may remain at the center of the channel body layer 20 (or conductive layer 84). Furthermore, an insulating layer may be formed in this space. The insulating film 83 does not need to be located adjacent to the insulating layer 82, because the function of a capacitor is achieved as long as the insulating film 83 is provided between the electrode layer 80 and the conductive layer 84.

The effect of this embodiment is now described with reference to FIG. 4, and FIG. 12 described below.

Figure 12A:
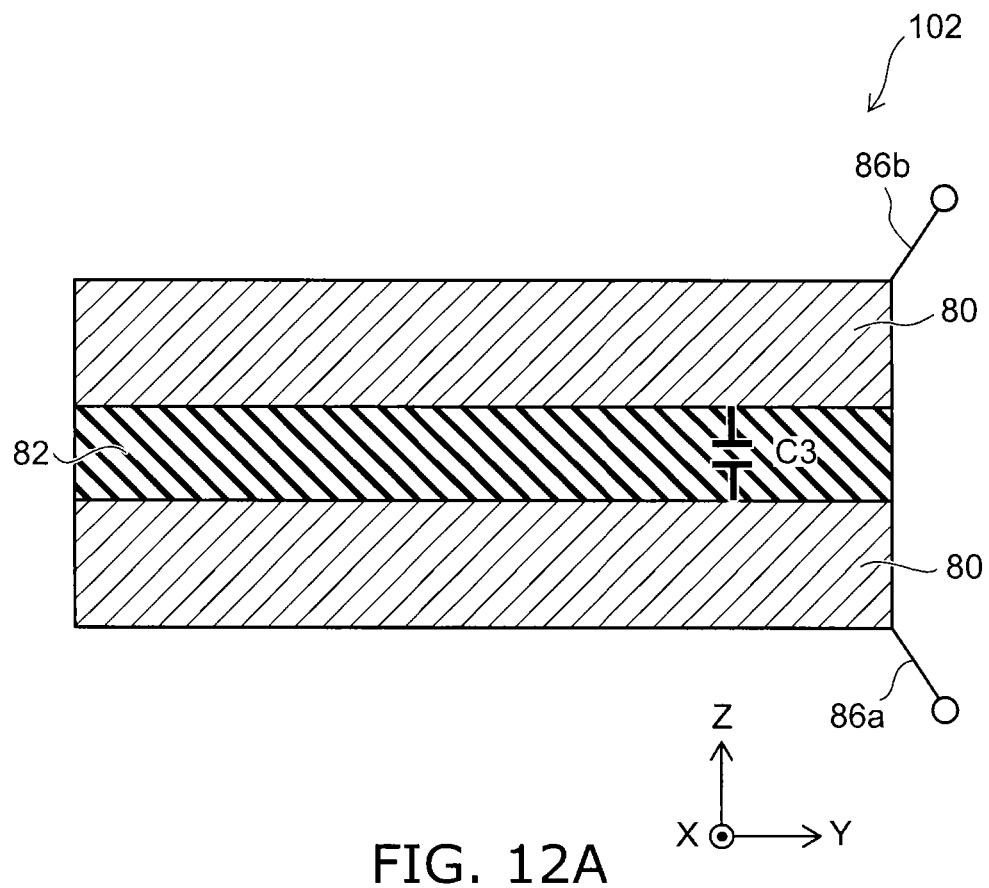
FIG. 12A is a schematic sectional view enlarging the capacitance element region of a nonvolatile semiconductor memory device according to a reference example and FIG. 12B shows an equivalent circuit of FIG. 12A.
Figure 12B:
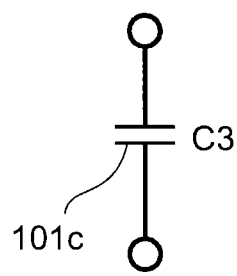

FIG. 12A is a schematic sectional view enlarging the capacitance element region of a nonvolatile semiconductor memory device according to a reference example. FIG. 12B shows an equivalent circuit of FIG. 12A.

In the capacitance element region 102 according to the reference example, the conductive layer 84 and the insulating film 83 are not provided. The rest of the configuration is identical to the configuration of the capacitance element region 101.

Here, the thickness of the electrode layer 80 is set to 50 nm. The thickness of the insulating layer 82 is set to 50 nm. The outer diameter of the insulating film 83 in a cross section cutting the insulating film 83 along the X-Y plane is set to 80 nm, and the inner diameter is set to 60 nm. The thickness of the insulating film 83 is set to 10 nm. The outer diameter of the memory film 30 in a cross section cutting the memory film 30 along the X-Y plane is set to 80 nm, and the inner diameter is set to 36 nm.

The material of the electrode layer 80 is identical to that of the electrode layer 40. The material of the insulating layer 82 is identical to that of the insulating layer 42. The material of the insulating film 83 is identical to that of the memory film 30. These materials are illustrative only, and not limited thereto.

For the calculation of capacitance, TEG (test element group) is used.

First, a model is fabricated as a TEG. In this model, 1000 pieces ($1.048 \times 10^3$ pieces) of insulating films 83 are arranged in a planar region of 117 μm×271 μm. This model corresponds to one insulating film 83 in a region of 200 nm×132 nm.

The vertically adjacent electrode layers 80 are applied with a voltage of 3 V through the contact electrodes. Then, in the reference example, the total capacitance was $2.0 \times 10^{-11}$ (F). However, in this embodiment, the total capacitance was $2.6 \times 10^{-11}$ (F). That is, the capacitance is higher in this embodiment than in the reference example.

In this embodiment, it might be considered that the parallel plate capacitance (C3) is decreased by the amount of forming the hole 76 in the electrode layer 80. This is because the area of the electrode layer 80 is decreased by the area of the hole 76 in the X-Y cross section (the circle with a diameter of 80 nm). For instance, in another calculation example, providing one insulating film 83 results in decreasing the parallel plate capacitance by $3.56 \times 10^{-18}$ (F) per one insulating film 83.

However, the capacitance (C1, C2) due to the insulating film 83, even if series connected, is increased by $9.66 \times 10^{-18}$ (F) ($1.93 \times 10^{-17}$ (F) per one piece). That is, as a net result, the capacitance is increased by $6.11 \times 10^{-18}$ (F). Multiplying this by the number of insulating films 83, i.e., $1.048 \times 10^3$, makes $6.4 \times 10^{-12}$ (F). This value is larger than $2.6 \times 10^{-11}$ (F) described above. Here, with regard to the dimensions of the insulating film 83, the outer diameter is set to 80 nm, the inner diameter is set to 60 nm, and the height in the Z direction is set to 25 nm.

The height of the insulating film 83 is set not to 50 nm, but to its half, 25 nm. This is based on the consideration that in the cylindrical insulating film 83, actually, the right (or left) half is in contact with the electrode layer 80 (see FIG. 4).

Thus, according to this embodiment, the electrical capacitance can be increased by providing a plurality of conductive layers 84 and an insulating film 83 between each of the plurality of conductive layers 84 and each of the plurality of electrode layers 80. Furthermore, the increase of electrical capacitance broadens the options of electrical capacitance. This can increase the design flexibility of electrical capacitance.

According to this embodiment, the increased options of electrical capacitance result in increasing the flexibility in the area design of the capacitance element region 101. For instance, suppose that the electrical capacitance can be increased by a factor of n. In this case, if the value of electrical capacitance is selected with a factor of 1, the area of the capacitance element region 101 can be decreased by a factor of n. Furthermore, reduction in the area of the capacitance element region 101 increases the flexibility in the layout of other members (elements, contact electrodes etc.).

According to this embodiment, the capacitance element region 101 can be provided in the nonvolatile semiconductor memory device 1. This eliminates the need of providing a capacitance element outside the nonvolatile semiconductor memory device 1. Thus, in the nonvolatile semiconductor memory device 1, cost increase is suppressed.

According to this embodiment, the process for manufacturing the memory element region 100 and the process for manufacturing the capacitance element region 101 can be simultaneously advanced. That is, there is no need of the apparatus dedicated for forming the capacitance element region 101. Furthermore, there is no need of the manufacturing process for separately forming the memory element region 100 and the capacitance element region 101. This suppresses the increase of the manufacturing process.

In the capacitance element region 101, to further increase the capacitance per unit area, the thickness of the insulating film 83 is preferably thinner. For instance, the thickness of the insulating film 83 may be made thinner than the thickness of each of the plurality of insulating layers 82. This is because reduction in the thickness of the insulating film results in increasing the capacitance $(C1 \times C2)/(C1+C2)$. This increases the capacitance $C3+(C1 \times C2)/(C1+C2)$.

The thickness of the insulating film 83 can be controlled by the following method. For instance, at the stage shown in FIG. 11, the insulating film 83 is formed to a prescribed thickness. Then, the upper side of the capacitance element region 101 is masked. In the memory element region 100, from the viewpoint of optimizing the cell operation, the film formation is continued also after the masking. For instance, when the film thickness of the insulating film 83 reaches 10 nm, the upper side of the capacitance element region 101 is masked. Then, the film formation is continued until the film thickness of the memory film 30 reaches 22 nm.

The aforementioned capacitance element region 101 may be provided in a memory device other than the nonvolatile semiconductor memory device. For instance, this capacitance element region 101 may be provided in conjunction with a memory cell array of spin injection MRAM (magnetoresistive random access memory) elements, or ReRAM (resistance random access memory) elements equipped with diodes. In this case, the stacked structure of the memory cell array is different from the stacked structure of the capacitance element region 101. However, the capacitance element region 101 may be protected by a mask or the like as necessary, and the process for forming the memory cell array may be advanced in a separate process.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
    a foundation layer; and
    a memory element region and a capacitance element region provided on the foundation layer,
    the memory element region including:
        a first stacked body provided on the foundation layer, the first stacked body having first electrode layers and first insulating layers, and each of the first electrode layers and each of the first insulating layers being stacked alternately in the first stacked body;
        a select gate electrode provided on the first stacked body;
        a semiconductor layer extending from an upper end of the select gate electrode to a lower end of the first stacked body;
        a first insulating film provided between the semiconductor layer and each of the first electrode layers; and
        a gate insulating film provided between the select gate electrode and the semiconductor layer,
    the capacitance element region including:
        a second stacked body provided on the foundation layer, the second stacked body having second electrode layers and second insulating layers, and each of the second electrode layers and each of the second insulating layers being stacked alternately in the second stacked body;
        conductive layers extending from an upper end of the second stacked body to a lower end of the second stacked body; and
        a second insulating film provided between each of the conductive layers and each of the second electrode layers, and
        a first capacitor and a second capacitor being provided in the capacitance element region,
        the first capacitor being made of one of the second insulating layers and a pair of the second electrode layers sandwiching the one of the second insulating layers, and
        the second capacitor being made of the second insulating film, and one of the second electrode layers and one of the conductive layers sandwiching the second insulating film.

2. The device according to claim 1, wherein
    the capacitance element region further includes:
        a first contact electrode connected to one of the pair of the second electrode layers; and
        a second contact electrode connected to the other of the pair of the second electrode layers,
        the first capacitor is connected between the first contact electrode and the second contact electrode, and
        the second capacitor and another second capacitor are connected in series via one of the conductive layers, and the second capacitor and the another second capacitor are connected between the first contact electrode and the second contact electrode.

3. The device according to claim 1, wherein thickness of the second insulating film is thinner than thickness of each of the second insulating layers.

4. The device according to claim 1, wherein thickness of the first stacked body is equal to thickness of the second stacked body.

5. The device according to claim 1, wherein number of layers of the first stacked body is equal to number of layers of the second stacked body.

6. The device according to claim 1, wherein the second electrode layers stacked at odd-numbered levels from bottom of the second stacked body can be applied with a first potential, and the second electrode layers stacked at even-numbered levels from the bottom of the second stacked body can be applied with a second potential.

7. The device according to claim 1, wherein material of each of the first electrode layers is identical to material of each of the second electrode layers.

8. The device according to claim 1, wherein material of each of the first insulating layers is identical to material of each of the second insulating layers.

9. The device according to claim 1, wherein material of the first insulating film is identical to material of the second insulating film.

10. The device according to claim 1, wherein material of the semiconductor layer is identical to material of each of the conductive layers.

* * * * *